(12) United States Patent
Yin et al.

(10) Patent No.: US 7,270,917 B2
(45) Date of Patent: Sep. 18, 2007

(54) PREVENTION OF PHOTORESIST SCUMMING

(75) Inventors: Zhiping Yin, Boise, ID (US); Jingyi Bai, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 11/471,012

(22) Filed: Jun. 20, 2006

(65) Prior Publication Data

US 2006/0240340 A1    Oct. 26, 2006

Related U.S. Application Data

(62) Division of application No. 10/940,805, filed on Aug. 31, 2004, now Pat. No. 7,175,944.

(51) Int. Cl.
*G03F 1/00* (2006.01)
*G03C 5/00* (2006.01)

(52) U.S. Cl. .......................... 430/5; 430/311; 430/322

(58) Field of Classification Search .................... 430/5, 430/311, 322
See application file for complete search history.

(56) References Cited

U.S. PATENT DOCUMENTS

| | | | |
|---|---|---|---|
| 4,442,197 | A | 4/1984 | Crivello et al. |
| 4,603,101 | A | 7/1986 | Crivello |
| 4,624,912 | A | 11/1986 | Zweifel et al. |
| 5,100,503 | A | 3/1992 | Allman et al. |
| 5,100,505 | A | 3/1992 | Cathey, Jr. |
| 5,128,232 | A | 7/1992 | Thackeray et al. |
| 5,344,742 | A | 9/1994 | Sinta et al. |
| 5,879,856 | A | 3/1999 | Thackeray et al. |
| 6,329,117 | B1 | 12/2001 | Padmanaban et al. |
| 6,528,235 | B2 | 3/2003 | Thackeray et al. |
| 6,890,448 | B2 | 5/2005 | Pavelchek |

2006/0046161 A1    3/2006  Yin et al.

OTHER PUBLICATIONS

Devadoss et al., "Investigation of BARC-resist Interfacial Interactions," Proceedings of SPIE, vol. 5040, pp. 912-922 (2003).
Ding et al., "Optimization of Bottom Antireflective Coating Materials for Dual Damascene Process," Proceedings of SPIE, vol. 3999, pp. 910-918 (2000).
Guerrero et al., "A New Generation of Bottom Anti-Reflective Coatings (BARCs): Photodefinable BARCs," Proceedings of SPIE, vol. 5039, pp. 129-136 (2003).
Lamanna et al., "New Ionic Photo-Acid Generators (PAGs) Incorporating Novel Perfluorinated Anions," Advances in Resist Technology and Processing XIX, Proceedings of SPIE, vol. 4690, pp. 817-828 (2002).
Lamb III et al., "Organic ARC® Anti-Reflective Coating Application within the Microelectronics Industry," Semiconduct Fabtech, 2$^{nd}$ Edition, 10 pages (1995).
Pawlowski et al., "Acetal-Based DUV Photoresists for Sub-Quarter Micron Lithography," Semiconduct Fabtech, 6$^{th}$ Edition, 11 pages (1997).
Peterson et al., "Approaches to Reducing Edge Roughness and Substrate Poisoning of ESCAP Photoresists," Semiconduct Fabtech, 8$^{th}$ Edition, pp. 183-188 (1998).
Pistor, Thomas V. "A New Photoresist Simulator from Panoramic Technology," Panoramic Technology, 19 pages (2002).

*Primary Examiner*—Geraldina Visconti
(74) *Attorney, Agent, or Firm*—Knobbe, Martens, Olson & Bear, LLP

(57) ABSTRACT

A photo acid generator (PAG) or an acid is used to reduce resist scumming and footing. Diffusion of acid from photoresist into neighbors causes a decreased acid level, and thus causes resist scumming. An increased acid layer beneath the resist prevents acid diffusion. In one embodiment, the increased acid layer is a layer of spun-on acid or PAG dissolved in aqueous solution. In another embodiment, the increased acid layer is a hard mask material with a PAG or an acid mixed into the material. The high acid content inhibits the diffusion of acid from the photoresist into neighboring layers, and thus substantially reduces photoresist scumming and footing.

23 Claims, 5 Drawing Sheets

PREVENTION OF PHOTORESIST SCUMMING

CROSS REFERENCE TO RELATED APPLICATION

This application is a divisional of U.S. application Ser. No. 10/940,805, filed Aug. 31, 2004 U.S Pat. No. 7,175,944.

BACKGROUND OF THE INVENTION

1. Field of the Invention

The present invention relates to the field of integrated circuit fabrication, specifically to the field of microlithography.

2. Description of the Related Art

Modern integrated circuits are getting more dense and compact. To accommodate smaller features, new photoresists are being used. Currently, UV wavelengths of 248 nm and 193 nm are being used for microlithography tools. Soon, the exposure will be carried out at even lower wavelengths, including 157 nm. These low wavelengths will allow for the use of sub-70 nm features. To remove photoresist, a chemical distinction is provided between exposed and unexposed resist. This is primarily done through the use of photo acid generators (PAG), photoactive materials that form an acid upon UV exposure at the proper wavelength. That acid buildup allows for selective removal of exposed photoresist, while leaving unexposed resist in place.

A problem with small photoresist wavelengths arises from interfacial interactions between the resist and the underlying layers. One such problem is that the acid generated upon exposure diffuses into underlying layers. Because some of the acid has diffused out of the resist, sufficient acid may not remain to facilitate the removal of all of the exposed resist. Some of the exposed resist is then not removed from the surface of the underlying layer, leaving a "resist scum" that can cause fabrication failures. The resist scum can cause footing along the edges of the exposed photoresist, decreasing the width of the openings in the pattern. Ultimately, the scumming or footing of the resist on the surface of the underlayers could change the critical dimensions (CD) of the device. CD is defined as the dimensions of the smallest features (e.g., width of interconnect line, contacts, trenches, etc.) defined by photolithography in the course of semiconductor device/circuit manufacturing using a given technology.

Recently bottom anti-reflective coating (BARC) has been used beneath low wavelength photoresist. However, in some circumstances, the use of a BARC is impracticable due to integration issues. For example, when the BARC layer is organic, the etchant that removes the BARC can possibly damage any underlying organic layer.

Some methods have been tried to combat the diffusion problem with short wavelength photoresist. One such method is to put a thermal acid generator (TAG) into a BARC material. One example of this is U.S. Pat. No. 6,329,117, issued to Padmanaban, et al. When the TAG is heated, it creates an acid in the BARC. This higher acidity level discourages acid diffusion. However, this method usually requires a post-exposure bake (PEB) or other heating process. Additionally, in some fabrication processes, a BARC layer is not desired between the photoresist layer and an underlayer.

U.S. Pat. No. 6,528,235 issued to Thackeray et al. on Mar. 4, 2003 describes an anti-reflective coating layer, called an anti-halation layer, with an acid additive, such as acid generators and acids. The layer can be removed during resist stripping and easily etched through when etching the underlying substrate. The optional acid additive is added to catalyze the crosslinking reaction between a resin binder and the crosslinker. The anti-halation layer bonds to the photoresist during a thermal process.

Each of the above methods faces difficulties and disadvantages. Therefore, there is a need for methods and procedures for the prevention of resist footing and scumming.

SUMMARY OF THE INVENTION

In one aspect of the invention a method of forming a hard mask with improved pattern transfer is disclosed. The method comprises forming a first hard mask layer with an acid additive over a substrate. A photoresist layer is deposited over the first hard mask layer. The photoresist layer is patterned to form a pattern. The pattern is transferred to the first hard mask layer after the photoresist layer is patterned.

A method for forming a hard mask is disclosed in another aspect of the invention. The method comprises forming a first hard mask layer over a substrate and forming an acid layer over the first hard mask layer. The acid layer consists essentially of an acid and a diluting agent. A photoresist layer is deposited over the acid layer. The photoresist layer is patterned to form a pattern. The method further comprises transferring the pattern to the first hard mask layer below the acid layer.

In another aspect of the invention, a chemical precursor for a hard mask to prevent resist scumming is disclosed. The precursor comprises a spin-on dielectric deposition (SOD) precursor. The SOD precursor is selected to form an inorganic layer after solidifying. The precursor further comprises an acid additive.

In another aspect of the invention, a method of forming a hard mask resistant to photoresist scumming is disclosed. A spin-on deposition (SOD) precursor containing a photo acid generator is deposited over a substrate. The SOD precursor is solidified to form a first hard mask layer. A photoresist layer is deposited over the first hard mask layer. A pattern is exposed in the photoresist layer. The pattern in the photoresist layer is then developed. The pattern is transferred to the first hard mask layer after developing the pattern. The photoresist layer is then removed after transferring the pattern to the first hard mask layer.

DETAILED DESCRIPTION OF THE PREFERRED EMBODIMENTS

The significance of the problem of photoresist scumming and footing is growing because of the decreasing size of the resist and the circuits that are being patterned. Scumming, or resist remaining after development, is at least partially the result of resist that was not fully broken down by the acid generated in the resist. This scumming can cause footing and poorly formed features.

Figure 1A:
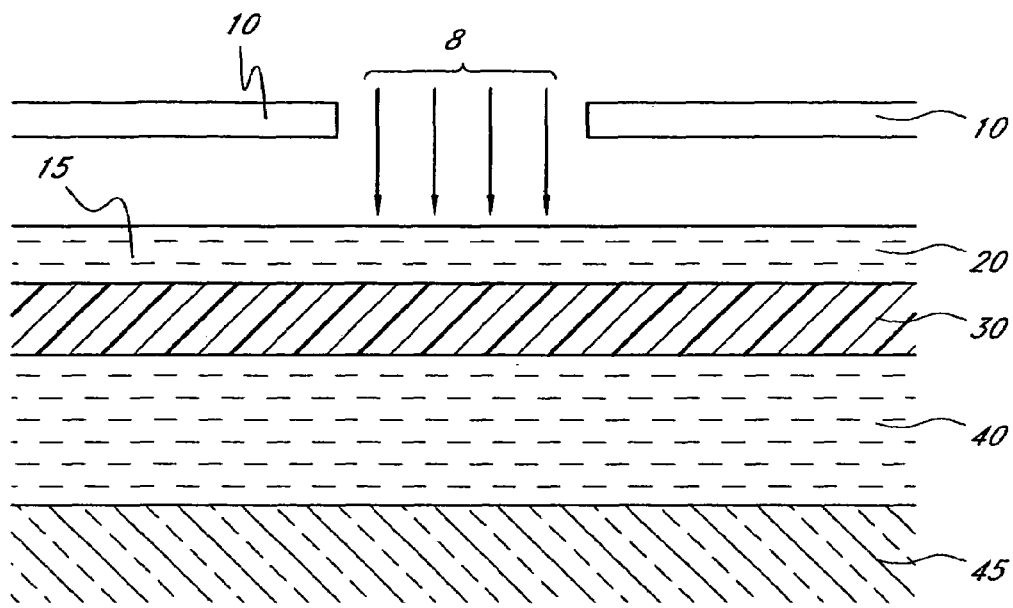
FIG. 1A is a schematic cross-sectional side view of a hard mask patterning structure.
Figure 1B:
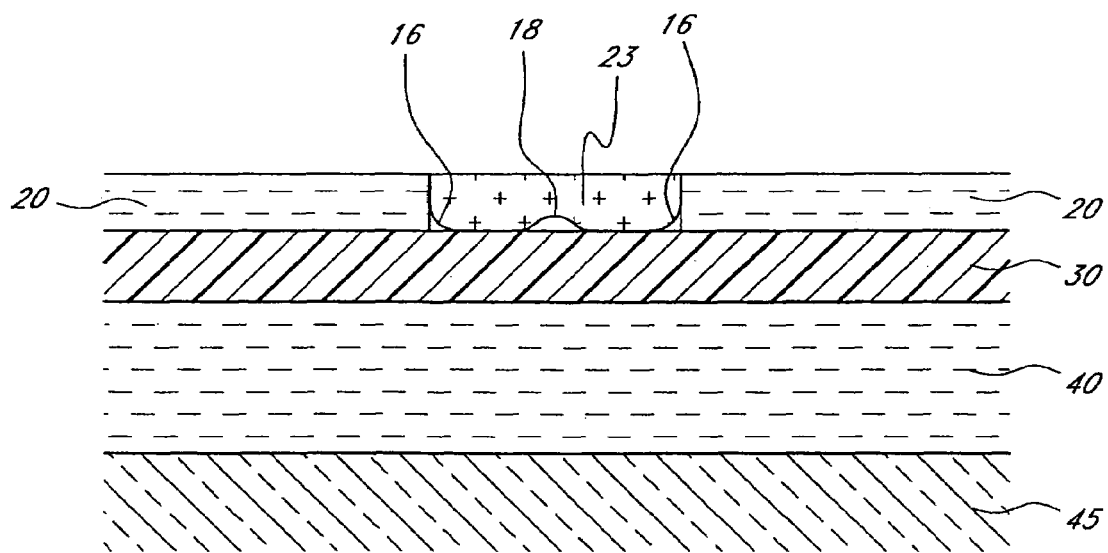
FIG. 1B is a schematic cross-sectional side view of the hard mask patterning structure of FIG. 1A after exposure to UV radiation.
Figure 1C:
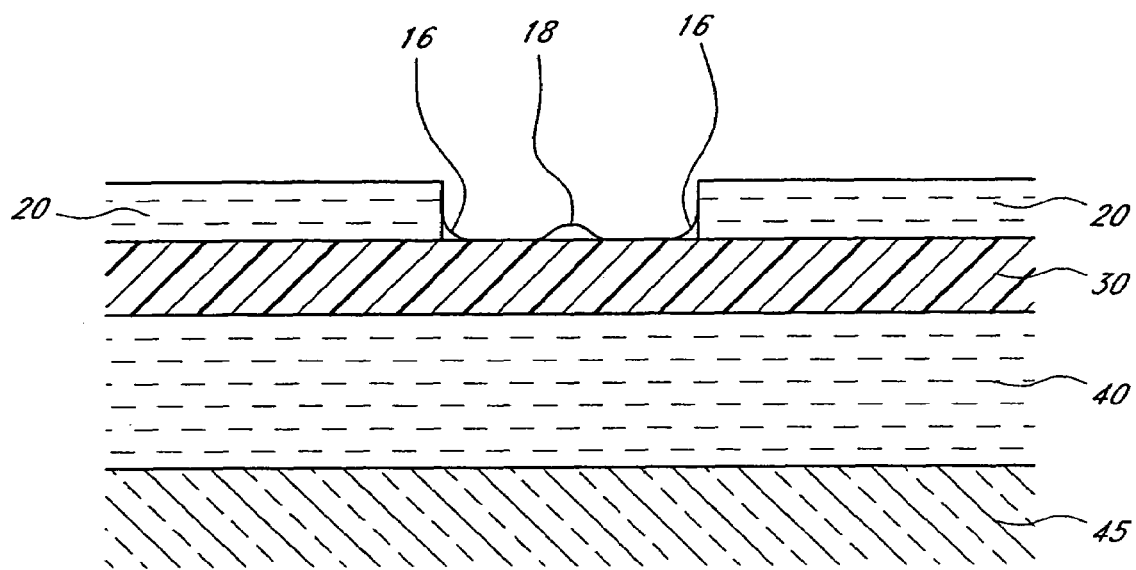
FIG. 1C is a schematic cross-sectional side view of the hard mask patterning structure of FIG. 1B after developing the resist pattern.

FIGS. 1A-1C illustrate a typical photoresist exposure and developing process and scumming effects. FIG. 1A shows a reticle 10 spaced above a photoresist layer 20. The photoresist 20 is over a first hard mask layer 30, a lower layer 40, and a substrate 45. The first hard mask layer 30, in this case an insulating underlayer such as an oxide, is directly beneath the resist 20. An illustrated lower layer 40 beneath the first hard mask layer 30 can be the substrate to be processed or an additional hard mask material. In the illustrated embodiment, the lower layer 40 comprises a layer of amorphous carbon 40 beneath the first hard mask layer 30. The substrate 45 is shown beneath the lower layer 40. The substrate 45 can represent any structure to be processed (e.g., etched) through the hard mask to be patterned. The resist 20 is exposed to UV radiation 8, thereby producing acid in the resist that allows the developing and removal of the resist 20. Using the reticle 10 is placed over the resist, only the desired portion of the resist will be exposed and subsequently developed.

FIG. 1B illustrates the acid generation in the exposed photoresist area 23. Acid is generated in the exposed area 23 when the photo acid generator (PAG) is exposed to UV radiation. Problems can arise in the developing of photoresist if the acid generated during exposure is not evenly distributed throughout the exposed area 23. However, in the illustrated embodiment, acid diffuses to neighboring layers that are less acidic than the exposed photoresist region 23. The diffusion of acid causes an acid deficiency around the edges of the exposed photoresist region 23. In the illustrated embodiment, the first hard mask layer 30 is directly beneath the photoresist. Many insulators have acid concentration that is substantially lower than exposed photoresist. The difference of the acidity level between the two neighboring layers encourages the diffusion of acid from the exposed photoresist area 23 into the first hard mask layer 30.

As illustrated in FIG. 1C, the exposed photoresist area 23 of a positive photoresist layer 20 has been removed by a developer chemical. Because of acid diffusion to the first hard mask layer 30, the photoresist has left a scum around the edges of the exposed area. As illustrated, the photoresist has left behind a corner footing 16 and a central scum layer 18 over the first hard mask layer 30. These scum layers can cause poor pattern transfer from the photoresist layer into the first hard mask.

The diffusion of acid into an underlayer can cause deviation from the intended pattern. Photoresist is used to pattern metal lines, hard masks, and other layers. The problems arising from acid diffusion between resist and neighboring layers can cause non-working components and connections, such as faulty transistors, disconnected metal lines, short circuits and associated problems. If proper patterning is not consistently achieved, lower yields result. This, in turn, increases overall production costs.

Process Flow

An exemplary process flow of the hard mask is seen in FIGS. 2-6. In FIG. 2A, the structure is shown being exposed to radiation 8, preferably UV radiation with a wavelength of a common lithography node (e.g., 157 nm, 193 nm, and 248 nm). The exposure of the photoresist 20 to UV radiation activates the photo acid generator (PAG) in the photoresist. In a preferred embodiment, a first hard mask layer 32 in accordance with a preferred embodiment is situated over a second hard mask layer 40 and a semiconductor substrate 45.

Figure 2A:
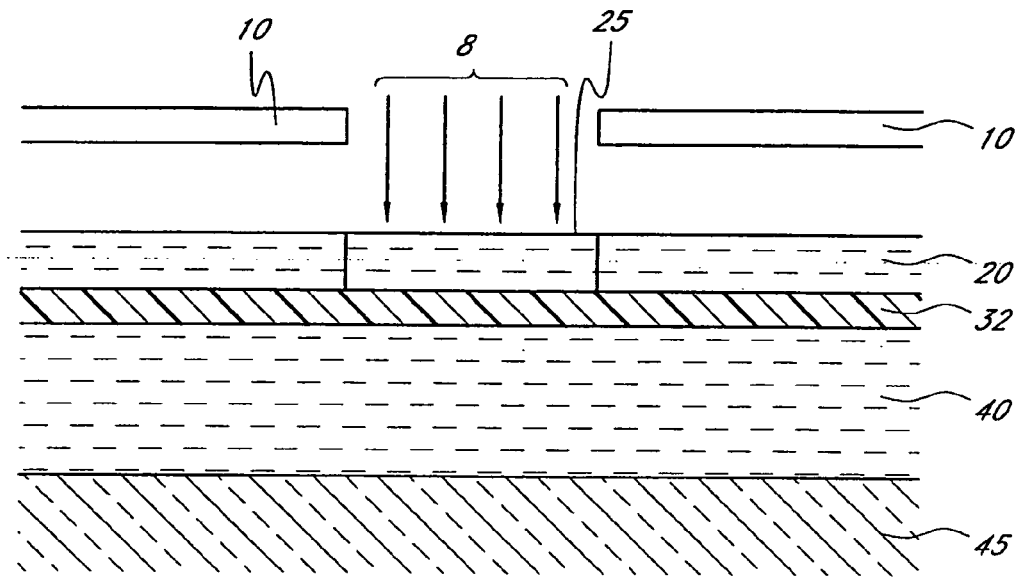
FIG. 2A is schematic cross-sectional side view of a hard mask patterning structure according to a preferred embodiment.

FIG. 2A illustrates the patterning of the photoresist layer 20 using a reticle 10, similar to the process of FIG. 1A. In a preferred embodiment, the lower or second hard mask layer 40 is a carbon layer, preferably amorphous carbon that can be used as a hard mask for etching the substrate 45. Amorphous carbon can be formed by several deposition processes, including chemical vapor deposition (CVD), sputtering, and ion beam deposition. The first hard mask layer 32 is preferably deposited by spin-on deposition (SOD).

In the illustrated embodiment of FIG. 2A, the photoresist layer 20 is preferably a positive photoresist, but negative photoresists can also be used for the photoresist layer 20. In a typical positive resist, a protective chemical that is affected by acid, rather than by heat or water, is used to protect the photoresist from the resist developer. Several common protective chemicals are used to mask the base solubilizing hydroxyl functionality of a polymer. Exemplary chemicals include a carbonate [e.g., t-boc (t-butoxycarbonyl)], ester, ether, acetal and ketal. A photoacid generator (PAG) generates an acid molecule and catalytically degrades the resist to a form susceptible to dissolution in the developer by breaking down a protective chemical on the resin in the light exposed regions during a post-exposure step, such as a post-exposure bake (PEB). While this reaction will take place very slowly at room temperature, it is much faster at PEB temperatures (60-150° C.), requiring only a few seconds to reach completion. In the absence of an acidic species, the protected polymer undergoes no degradation during prolonged heating at the PEB temperature.

However, if the acid generated by UV exposure in the photoresist layer 20 diffuses to an underlayer, such as the first hard mask layer 32, the resist layer will not be properly developed. In order to correct acid diffusion problems in accordance with the preferred embodiments, acid is increased in a layer below the exposed photoresist layer 20. Due to the dependence of diffusion upon relative acid concentrations, acid will diffuse from the more acidic layer to the less acidic layer. In accordance with the preferred embodiments, the acid level is increased beneath the photoresist layer 20 to correct acid diffusion problems. In an embodiment of the acid diffusion prevention process illustrated in FIGS. 2A and 3-6, a photo acid generator material is dissolved into a spin-on precursor material used for the first hard mask layer 32 in order to increase the acidity below the exposed resist layer 20. In an embodiment illustrated in FIG. 2B, an acid layer 25 is deposited to intervene between the photoresist layer 20 and first hard mask layer 32. These preferred methods of increasing the acidity of the underlayer will prevent many interfacial interaction problems between the photoresist layer 20 and the first hard mask layer 32.

First Hard Mask Layer

In a preferred embodiment, the acid concentration of the first hard mask layer 32 is coordinated with the photoresist layer 20. In one embodiment, the acidity level of a first hard mask layer 32, such as a spin-on deposition (SOD) dielectric material, is increased from typical levels of underlayer materials. Preferably, this is performed by introducing an acid additive, either an acid or an acid generator, into the precursor material of the first hard mask layer 32 before it is deposited over the substrate, although acid can alternatively be added during or after spin-on deposition and before curing.

In a preferred embodiment, an acid is mixed into the precursor of the first hard mask layer 32, preferably a spin on deposition dielectric precursor. Many acids can be mixed into the insulator precursor, but preferred acids to be used as the acid additive include organic acids, such as phosphoric acid ($H_3PO_4$), and hydrochloric acid (HCl). Preferred acid concentration levels of the SOD precursor with added acid is between about 0.005 mol/Liter and 0.1 mol/Liter. Skilled practitioners will appreciate that many types of acids can be used in the dielectric material to increase the acid concentration in the SOD precursor, without causing damage to neighboring layers.

Several types of spin on deposition dielectric materials can be used. Preferably, the SOD material is of a type that solidifies into an inorganic layer. The SOD material selected preferably produces a form of silicon-containing dielectric materials, such as silicon oxide, after curing. In one embodiment, a spin-on-glass (SOG) is used. SOGs are widely used and are available from several manufacturers, including Dow Corning, Inc. of Midland, Mich. and Clariant Life Sciences K. K. of Tokyo, Japan. Many of these films require a bake process, which makes the high temperature stability of ionic PAGs helpful. A preferred inorganic class of SOD precursor materials is the class of silazane materials, such as poly(perhydrosilazane) ($SiH_2NH$). These materials are available under the tradename Spinfil™ from Clariant Life Sciences K.K. The same company offers organic SOD materials, such as Poly(methylsil(sesqui)azane) ($SiCH_3N_{1.5}$), under the tradename Signiflow™. Another preferred class of SOD materials are silsesquioxane based materials. Two varieties of these products are available, organic and inorganic. Hydrogen silsesquioxane (HSQ) is a commonly available inorganic SOD material and methyl silsesquioxane (MSQ) is a common inorganic SOD material.

SOD materials typically are delivered with a manufacturer recommended baking, or solidifying, recipe. For example, the recommended baking recipe for one type of Spinfil calls for hot plate baking at about 150° C. for about 3 minutes, followed by furnace curing at between about 350° C.-800° C. for approximately 30 minutes in a steam ambient environment. Skilled practitioners will appreciate that there are several appropriate solidifying techniques.

Once the precursor of the first hard mask layer 32 is deposited onto the surface of the wafer and solidified to form a solid layer, the photoresist 20 can be applied over the first hard mask layer 32. During the exposure and developing of the photoresist 20, the acid generated by PAGs in the resist will be less likely to diffuse out because of the increased acidity of the directly underlying first hard mask layer 32. The exposure and developing process will continue as in a standard photoresist process, but reduced diffusion results in better patterning of the photoresist mask and subsequent layers.

In another preferred embodiment, a photo acid generator (PAG) is used to increase the acidity of the material that is used for the first hard mask layer 32. Preferably, the PAG is mixed into a spin-on deposition precursor material similar to the materials described above. When a PAG is exposed to UV radiation, the PAG forms an acid. Many PAG materials are available in the form of a powder, which enables them to be dissolved into liquid SOD precursor materials either with or without the use of a solvent such as propylene glycol monomethyl ether acetate (PGMEA). However, typically an SOD precursor material will contain a solvent that will dissolve a powder based PAG. For example, the Spinfil™ SOD precursor material contains dibutylether ($C_8H_{18}O$), which can dissolve many powder based PAG materials. Once the PAG is mixed into the precursor of the first hard mask layer 32, the precursor is deposited onto the wafer, preferably by a spin-on deposition tool in the same manner that it would ordinarily be processed. Because the consistency of the liquid precursor should not be substantially altered by the addition of the PAG powder, many spin-on tools are available for use in this application.

There are two primary types of PAGs currently in use. First, neutral, or non-ionic, PAGs are typically organic materials and are often accompanied by the addition of a sensitization additive in order to become photoactive. Non-ionic PAGs such as phloroglucinyl and o,o-dinitrobenzyl sulfonates, benzylsulfones and some 1,1,1-trihalides are more compatible with hydrophobic media in general, although their thermal stabilities and quantum yields for acid generation are often lower.

However, most of the PAGs currently used in resists with associated wavelengths of 248 nm, 193 nm, or 157 nm are ionic PAGs. Ionic PAGs are typically salts comprising a photoactive cation, also known as the counterion, and an anion. Many photoactive cations can be combined with several different anions to form a PAG. Unlike many neutral PAGs, ionic PAGs typically are capable of producing acid by direct UV irradiation (between 10 nm and 380 nm). The anion is typically not photosensitive, but it will usually determine the acid that is produced by the PAG. The cation will usually act as the photosensitive component and break down upon UV exposure. Common cations for PAG salts include triarylsulfonium and diaryliodonium. Salts using these cations have become common PAG ingredients in 248 nm resist formulations, because of their generally easy synthesis, thermal stability, high quantum yield for acid generation, and the strength and non-volatility of the acids they supply. Ionic PAGs generally have low volatility and high thermal stability, features that can be important during processing steps that require applying heat, such as a pre-bake or a post-bake step.

In a preferred embodiment, the acid additive used in the SOD precursor is an ionic PAG. Several PAG anions and cation combinations can be used in combination to form the PAG salt used in the first hard mask layer 32. PAGs can often be dissolved in liquids such as a photoresist, or in the case of the embodiments illustrated in FIGS. 2-6, a spin on deposition precursor. Preferred ionic PAG anions include antimony fluoride ($SbF_6^-$), and phosphorus fluoride ($PF_6^-$). These materials respectively react to form hydrogen hexafluoroantimonate ($HSbF_6$) and fluorophosphoric acid ($HPF_6$), respectively, upon UV exposure. Preferred cations include triarylsulfonium and diaryliodonium. Another preferred class of PAG materials breaks down to form carboxylic acid, such as diazoquinone PAGs. In one embodiment, the same PAG that is used in the photoresist is also used in the first hard mask layer 32. However, other PAGs available as a powder and subject to activation upon exposure to the UV wavelength used for the photoresist will be sufficiently effective to increase the acidity of a resist underlayer upon UV exposure. Alternatively the PAG in the first hard mask layer 32 can be activated by a separate exposure of a different wavelength. A skilled practitioner will appreciate that a broad range of PAGs will be useful in this context.

In a preferred embodiment, the PAG will be mixed into the SOD precursor before the spin-on deposition. Generally, a preferable percentage by weight of PAG in the SOD liquid precursor is between about 0.5% and 20%, more preferably between about 1% and 15% by weight.

In an exemplary embodiment, a PAG from the preferred class of PAG materials that breaks down to carboxylic acid is added to a silsesquioxane SOD precursor material. Between about 0.5 g and 1 g of the PAG are added to between about 100 g and 200 g of the liquid SOD precursor material to form a SOD precursor that will alleviate resist scumming. Preferably the ratio of PAG material to SOD precursor is between about 0.0025 and 0.01.

PAGs mixed into SOD precursors can also be used along with other hard mask materials. For example, a thin SOD layer with a PAG can be used over a thicker TEOS (tetra-ethylorthosilicate) oxide layer, nitride layer, or other hard mask material. Typically, these thicker hard masks will be deposited by a CVD process.

In another embodiment illustrated in FIG. 2B and further explained below, a thin layer of acidic material 25 is deposited between the resist 20 and the first hard mask layer 32. The acid layer 25 can be deposited by conventional deposition methods suitable for depositing liquid precursor materials, such as SOD or misting. Preferred materials for the acid layer 25 include organic acids, such as carboxylic acids, phosphoric acid ($H_3PO_4$) and hydrochloric acid (HCl). While the following process makes reference to the structure of FIG. 2A, the structure of FIG. 2B can also be used in a similar manner.

Figure 3:
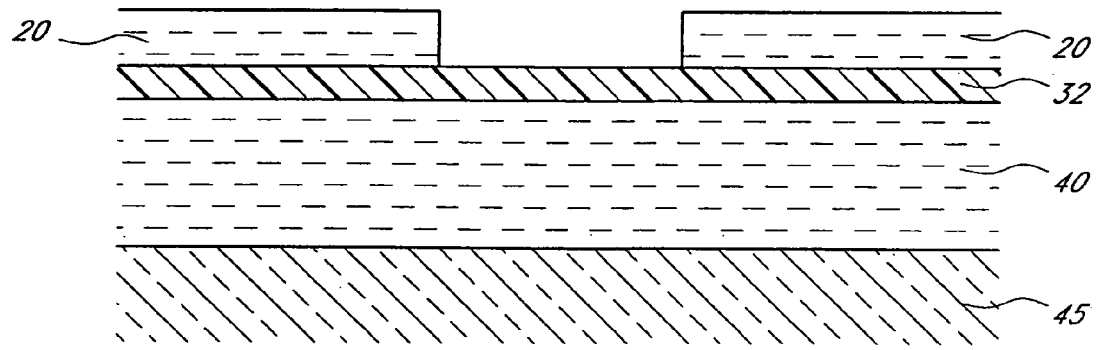
FIG. 3 is a schematic cross-sectional side view of the hard mask patterning structure of FIG. 2A after photoresist patterning.

FIG. 3 illustrates the structure of FIG. 2A after the photoresist layer 20 is patterned. The photoresist is developed to remove the exposed photoresist area 25. The resist material will be removed as masked with fewer scumming and footing problems on the first hard mask layer 32. The developing of the photoresist prepares the first hard mask layer 32 for patterning. The first hard mask layer 32, which preferably contains the acid additive, can then be used to etch or otherwise process the substrate 45 or the pattern can be first transferred to the optional second hard mask layer 40. The addition of the acid additive does not prevent the use of the first hard mask layer 32 as a hard mask for underlayers.

Figure 4:
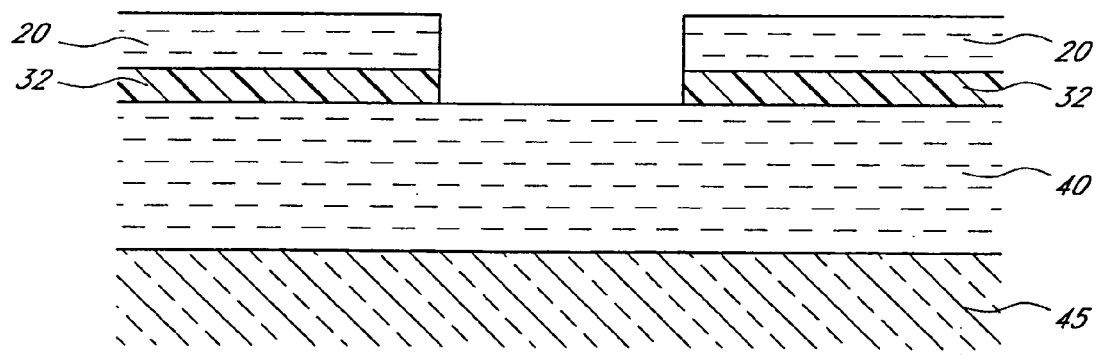
FIG. 4 is a schematic cross-sectional side view of the hard mask patterning structure of FIG. 3 after transferring the resist pattern to a first hard mask.

In FIG. 4, the unexposed portions of the resist layer 20 have been used as a soft mask to pattern the first hard mask layer 32. The first hard mask layer 32 is preferably patterned using an anisotropic etch using etchants such as fluoride reactive species or bromide reactive species. Skilled artisans will appreciate that there are several methods of etching the first hard mask layer 32.

The photoresist layer 20 can either be removed after etching the first hard mask layer 32 or it can be removed during the pattern transfer to the second hard mask layer 40. The removal of the photoresist layer 20 is preferably selective to the first hard mask layer 32. There are a wide variety of resist strippers available for this purpose. The skilled artisan can determine a proper resist stripper to remove the photoresist layer 20 without substantially damaging the first hard mask layer 32, which is preferably resistant to conventional organic strippers, such as oxygen plasma or aqueous organic solvents.

Figure 5:
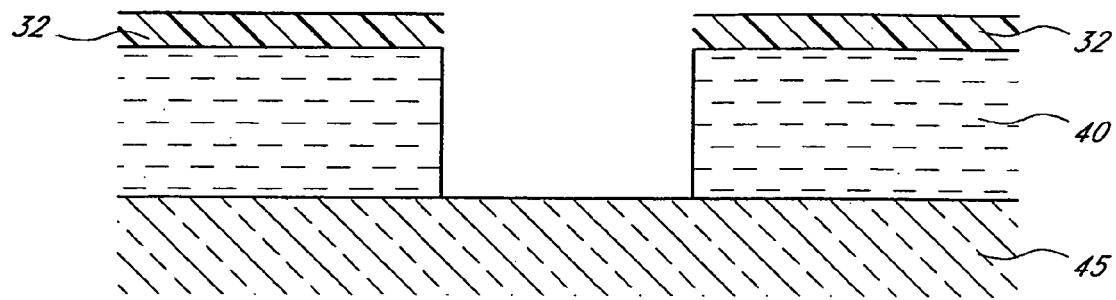
FIG. 5 is a schematic cross-sectional side view of the hard mask patterning structure of FIG. 4 after transferring the pattern to a lower layer.

FIG. 5 illustrates the removal of the photoresist layer 20 and a preferred step of transferring the pattern from the first hard mask layer 32 into the second hard mask layer 40. However, the first hard mask layer 32 can also be used to etch or otherwise process the substrate 45 directly. In a preferred embodiment, the lower layer 40 is a hard mask material, such as amorphous carbon, with a thickness of between about 1,000 Å and 14, 000 Å, more preferably between 2,500 Å and 12,000 Å In a preferred embodiment, the carbon-based second hard mask layer 40 is etched using a $O_2$ and $SO_2$ based plasma. This plasma etch process provides excellent selectivity to the first hard mask layer 32. Such a process is described in an application No. 10/931,772 entitled "Critical Dimension Control for Integrated Circuits" by Abatchev, et al., filed on Aug. 31, 2004. The disclosure of this application is incorporated by reference herein.

One preferred chamber for etching the carbon-based second hard mask layer 40 is Lam Research Corp.'s (Fremont, Calif.) TCP9400 poly etch chamber. In this chamber, the pressure is preferably between 3 mTorr and 20 mTorr, more preferably between about 5 mTorr and 15 mTorr. The ionizing source power, preferably delivered in situ, is preferably between 175 W and 400 W, more preferably between about 225 W and 350 W. The bias power is preferably between about 25 W and 125 W, more preferably between about 30 W and 100 W. The electrode temperature is preferably targeted to be between about −5° C. and 15° C., more preferably between about 0° C. and 10° C. Preferred precursor gasses include $SO_2$, $O_2$, Ne, and Ar. In a preferred embodiment with a single wafer, the flow rate for $SO_2$ is preferably between about 10 sccm and 75 sccm, more preferably between about 20 sccm and 60 sccm. The flow rate for $O_2$ is preferably between about 10 sccm and 100 sccm, more preferably between about 20 sccm and 80 sccm. The flow rate for Ar is preferably between about 0 sccm and 175 sccm, more preferably between about 0 sccm and 140 sccm. As seen in FIG. 5, when the lower layer 40 is etched, the unexposed resist 20 may also be removed.

In the figures, the substrate 45 is pictured as a semiconductor material. However, the substrate can be any material that is processed using a mask or a hard mask. Exemplary materials for the substrate 45 include semiconductor materials, conductive metals, insulating interlevel or intermetal dielectrics (ILD or IMD), or other type of integrated circuit material.

Figure 6:
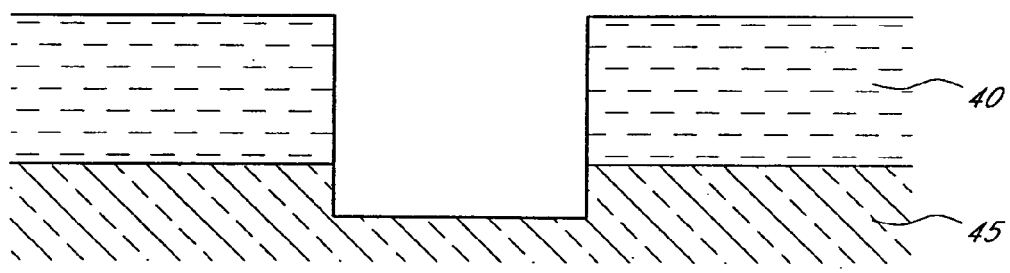
FIG. 6 is a schematic cross-sectional side view of the hard mask patterning structure of FIG. 5 after a substrate etch process.

FIG. 6 shows the etching of the substrate 45, preferably a semiconductor substrate. The substrate can be a number of materials, such as an insulating layer or a metallization layer. A skilled practitioner will appreciate that there are several acceptable methods of etching the substrate with a wide variety of parameters and that etchants and settings for etching the substrate 45 will vary based upon the etching equipment and substrate material selected.

An Acidic Layer

In an embodiment shown in FIG. 2B, a thin acid-rich layer 25 is deposited directly below a photoresist layer 20. The acid-rich layer 25 is deposited before the photoresist 20 is deposited. The acid-rich layer 25 prevents the acid diffusion between an under layer and the photoresist 20. Preferably, the acid layer is deposited directly over a first hard mask 30. The first hard mask layer 30 can be a spin-on dielectric layer, a plasma enhanced CVD silicon oxide or silicon oxynitride layer, a TEOS oxide layer, or any other suitable hard mask material. Preferably the thickness of the first hard mask 30 is between about 100 Å and 1000 Å, more preferably between about 150 Å and 500 Å. Skilled practitioners will appreciate that the acid-rich layer 25 can be used over several different materials for the first hard mask layer 30.

Preferably, the acid-rich layer 25 is deposited on the wafer as a liquid, and is dried before the deposition of resist 20. In a preferred embodiment, the precursor of the acid-rich layer is an acid diluted with a diluting agent, such as water or propylene glycol monomethyl ether acetate (PGMEA). In a preferred embodiment, the acid-rich layer 25 is deposited onto the wafer by spin-on deposition or direct liquid injection tools. An acid-rich liquid is dripped onto the wafer as a liquid, then the wafer is spun to distribute the material. In another embodiment, a dip and dry process is used to apply the liquid acidic layer. In this embodiment, the wafer is dipped in an acid solution and dried to form the thin acid-rich layer 25. Preferably, the acid-rich layer 25 is very thin, between about 10 Å and 100 Å, more preferably between about 15 Å and 40 Å. Skilled practitioners will appreciate that there are several methods in which to apply the acid-rich layer 25.

Preferred materials include the general set of acids. More preferably, the acid layer is a form of phosphoric acid ($H_3PO_4$) or hydrochloric acid (HCl). Preferably, the acid is diluted so that neighboring layers are not damaged by the acid. An acid layer 25 can be formed using HCl or $H_3PO_4$ with a concentration of acid of between about 0.01 mol/Liter and 0.1 mol/Liter, more preferably between about 0.025 mol/Liter and 0.075 mol/Liter. Other acids can also be used but depending on the etching capabilities of the acid, they will be more or less appropriate for the use over the first hard mask layer 30.

A liquid PAG solution could also be used in place of the layer of acid as the acid rich layer 25. In a preferred embodiment, the liquid PAG solution is a PAG diluted with a solvent such as water or PGMEA. When the photoresist layer 20 above the dissolved PAG layer 25 is exposed to UV, the PAG in the acid rich layer 25 forms an acid which inhibits the diffusion of acid from the photoresist 20 into the first hard mask 30. Preferably, the liquid is applied either by a spin-on deposition process or by a dip-dry process as described above. The layer is also preferably quite thin, having a thickness of between about 10 Å and 100 Å, more preferably between about 15 Å and 40 Å. Preferred PAG materials are easily soluble in an appropriate solvent, such as water or PGMEA. The skilled practitioner will appreciate that several PAG materials and solvents will satisfy the requirements for the thin PAG layer.

The provision of an acid or PAG layer under a resist layer is also useful in any context where resist scumming is a problem. However, it is important to note that the acid or PAG is preferably selected in conjunction with the selection of neighboring layers in order to minimize damage to the neighboring layers. The effects of scumming often require a special "de-scumming" step, the need and/or vigor of which can be substantially reduced through the use of an acid diffusion prevention system of the present invention.

Structure

Preferred embodiments are used as hard masks for an etching process. In one embodiment seen in FIG. 4, the second hard mask layer 40 is over a substrate 45. The substrate 45 is pictured as a semiconductor layer in this figure. The second hard mask layer 40 is preferably a thick layer that can be used as a hard mask for etching the material below. In one preferred embodiment, the second hard mask layer 40 is a carbon-based material, such as amorphous carbon. The second hard mask layer 40 preferably has a thickness of between about 500 Å and 15,000 Å, more preferably between about 1500 Å and 10,000 Å.

Over the second hard mask layer 40 is the first hard mask layer 32 which can be used as a hard mask for the second hard mask layer 40 (when present) or for the substrate. In one embodiment, the dielectric layer 32 is a spin-on deposition dielectric containing a PAG material or other source of acidity. The acidic first hard mask layer 32 preferably has a thickness of between about 100 Å and 1000 Å thick, more preferably between about 150 Å and 600 Å.

Figure 2B:
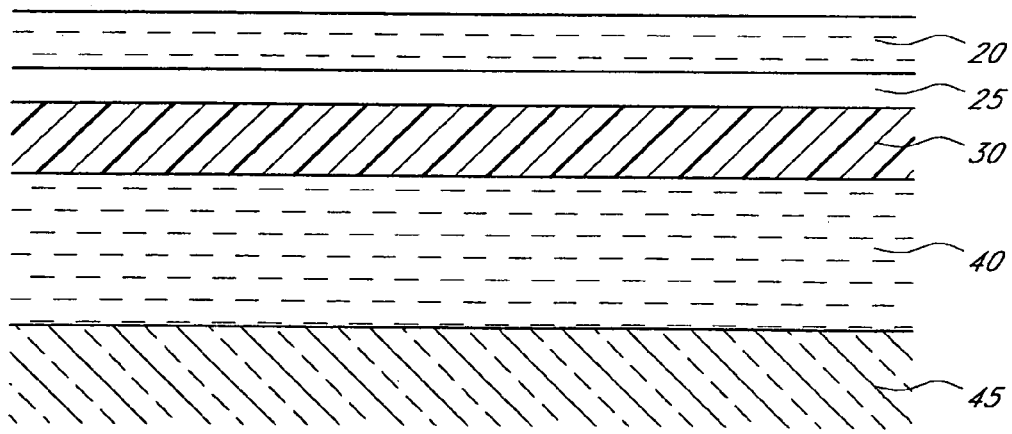
FIG. 2B is a schematic cross-sectional side view of a hard mask patterning structure according to another preferred embodiment.

In another embodiment illustrated in FIG. 2B, an acid rich layer 25 is over a first hard mask layer 30. The acid rich layer 25 is preferably deposited in the form of a standard liquid acid solution or as a liquid acid generator solution. Preferably, the acid rich layer 25 is between about 10 Å and 100 Å, more preferably between about 15 Å and 40 Å. Preferred acids include $H_3PO_4$ and HCl. The acid rich layer 25 and the first hard mask 30 together are between about 120 Å and 1000 Å, more preferably between about 200 Å and 600 Å. The second hard mask layer 40 is similar to the lower layer as described with reference to FIG. 4. The second hard mask layer 40 preferably has a thickness of between about 500 Å and 15,000 Å, more preferably between about 1500 Å and 10,000 Å.

While the use of acid additives in a liquid spin-on dielectric precursor is described in the context of a hard mask, it can also be used in other contexts. Specifically, it can be used wherever a photoresist layer is in direct contact with a hard mask layer that is susceptible to diffusion.

In addition to straight anisotropic pattern transfer, "transferring a pattern" from one layer to another layer can also encompass intervening modification of a mask pattern. For example, a soft mask can be processed in order to shrink or grow the feature size. The mask pattern can be altered prior to, after, or during transfer to the first hard mask layer 32 or the second hard mask layer 40.

Although this invention has been described in terms of a certain preferred embodiment and suggested possible modifications thereto, other embodiments and modifications may suggest themselves and be apparent to those of ordinary skill in the art are also within the spirit and scope of this invention. Accordingly, the scope of this invention is intended to be defined by the claims which follow.

We claim:

1. A method for forming a hard mask, comprising:
   forming a first hard mask layer over a substrate;
   forming an acid layer over the first hard mask layer;
   depositing a photoresist layer over the acid layer;
   patterning the photoresist layer to form a pattern; and
   transferring the pattern to the first hard mask layer below the acid layer.

2. The method of claim 1, wherein the acid layer consists essentially of an acid and a diluting agent.

3. The method of claim 2, wherein the diluting agent comprises at least one of water or propylene glycol monomethyl ether acetate.

4. The method of claim 1, wherein forming the acid layer comprises forming a layer comprising phosphoric acid.

5. The method of claim 1, wherein forming the acid layer comprises forming a layer comprising hydrochloric acid.

6. The method of claim 1, wherein forming the acid layer comprises forming a layer comprising a photo acid generator.

7. The method of claim 6, wherein the photo acid generator comprises an ionic photo acid generator.

8. The method of claim 1, wherein the acid layer is formed by spin-on deposition.

9. The method of claim 1, wherein the acid layer is formed by a dip and dry process.

10. The method of claim 1, wherein the acid layer is formed by misting.

11. The method of claim 1, wherein the acid layer has a concentration of an acid of from about 0.01 mol/L to about 0.1 mol/L.

12. The method of claim 11, wherein the concentration of the acid is from about 0.025 mol/L to about 0.075 mol/L.

13. The method of claim 1, wherein the acid layer has a thickness of from about 10 Å to about 100 Å.

14. The method of claim 13, wherein the acid layer has a thickness of from about is 15 Å to about 40 Å.

15. The method of claim 1, wherein the acid layer is dried before depositing the photoresist layer.

16. The method of claim 1, wherein the first hard mask layer comprises at least one of spin-on dielectric, plasma-enhanced CVD silicon oxide, plasma-enhanced CVD silicon nitride, or TEOS oxide.

17. The method of claim 1, wherein the substrate comprises a semiconductor substrate.

18. The method of claim 1, wherein a second hard mask layer is disposed between the substrate and the first hard mask layer.

19. The method of claim 18, wherein the second hard mask layer comprises amorphous carbon.

20. The method of claim 18, further comprising transferring the pattern from the first hard mask layer to the second hard mask layer.

21. The method of claim 20, further comprising removing the first hard mask layer after transferring the patter to the second hard mask layer.

22. The method of claim 1, wherein the photoresist layer comprises a positive photoresist.

23. A method for forming a hard mask, comprising:
   forming a first hard mask layer over a substrate;
   forming a second hard mask layer over the first hard mask layer;
   forming a layer comprising a means for providing an acid over the second hard mask layer;
   depositing a photoresist layer; and
   patterning the photoresist layer to form a pattern; and
   transferring the pattern to the second hard mask layer.

* * * * *

UNITED STATES PATENT AND TRADEMARK OFFICE
CERTIFICATE OF CORRECTION

PATENT NO. : 7,270,917 B2  Page 1 of 1
APPLICATION NO. : 11/471012
DATED : September 18, 2007
INVENTOR(S) : Yin et al.

It is certified that error appears in the above-identified patent and that said Letters Patent is hereby corrected as shown below:

In column 11, line 17, in Claim 14, before "15 Å" delete "is".

In column 12, line 10, in claim 21, delete "patter" and insert -- pattern --, therefor.

Signed and Sealed this

Twenty-seventh Day of November, 2007

JON W. DUDAS
*Director of the United States Patent and Trademark Office*